United States Patent
Sun et al.

(10) Patent No.: US 11,411,151 B2
(45) Date of Patent: Aug. 9, 2022

(54) LIGHT EMITTING PANEL AND DISPLAY DEVICE

(71) Applicant: Shanghai Tianma Micro-Electronics Co., Ltd., Shanghai (CN)

(72) Inventors: Xiaoping Sun, Shanghai (CN); Lihua Wang, Shanghai (CN); Conghua Ma, Shanghai (CN); Liwen Lu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 151 days.

(21) Appl. No.: 17/092,336

(22) Filed: Nov. 9, 2020

(65) Prior Publication Data

US 2021/0057624 A1    Feb. 25, 2021

(30) Foreign Application Priority Data

Aug. 18, 2020   (CN) .......................... 202010831791.8

(51) Int. Cl.
| | |
|---|---|
| *H01L 33/62* | (2010.01) |
| *H01L 27/15* | (2006.01) |
| *H05K 1/18* | (2006.01) |
| *H01L 33/38* | (2010.01) |

(52) U.S. Cl.
CPC ............ *H01L 33/62* (2013.01); *H01L 27/156* (2013.01); *H01L 33/38* (2013.01); *H05K 1/189* (2013.01)

(58) Field of Classification Search
CPC combination set(s) only.
See application file for complete search history.

(56) References Cited

U.S. PATENT DOCUMENTS

| | | | | |
|---|---|---|---|---|
| 2016/0178949 A1* | 6/2016 | Wang | ................ | G02F 1/134309 345/173 |
| 2019/0332224 A1* | 10/2019 | Bok | ....................... | G06F 3/0448 |
| 2020/0185458 A1* | 6/2020 | Chen | ..................... | G06F 3/0448 |

FOREIGN PATENT DOCUMENTS

| | | |
|---|---|---|
| CN | 209692916 U | 11/2019 |
| CN | 110831342 A | 2/2020 |

* cited by examiner

*Primary Examiner* — Mark W Tornow
*Assistant Examiner* — Priya M Rampersaud
(74) *Attorney, Agent, or Firm* — Kilpatrick Townsend & Stockton, LLP

(57) ABSTRACT

A light emitting panel and a display device are provided. The light emitting panel includes a carrier substrate, and multiple connection electrodes, multiple first electrode leads and multiple second electrode leads that are arranged on the carrier substrate. Each connection electrode includes a first sub-connection electrode and a second sub-connection electrode isolated from each other. The connection electrodes are divided into a first connection electrode group to an N-th connection electrode group. An i-th connection electrode group includes connection electrodes. N is an integer greater than or equal to 2, and i is a positive integer less than or equal to N. First sub-connection electrodes in the i-th connection electrode group are electrically connected with a same first electrode lead, and second sub-connection electrodes in the i-th connection electrode group are respectively connected with different second electrode leads.

20 Claims, 16 Drawing Sheets

LIGHT EMITTING PANEL AND DISPLAY DEVICE

CROSS-REFERENCES TO RELATED APPLICATIONS

The present application claims the priority to Chinese Patent Application No. 202010831791.8, titled "LIGHT EMITTING PANEL AND DISPLAY DEVICE", filed on Aug. 18, 2020 with the Chinese Patent Office, which is incorporated herein by reference in its entirety.

FIELD

The present disclosure relates to the field of display, and in particular to a light emitting panel and a display device.

BACKGROUND

With the increasing development of the communication technology, display devices, such as mobile phones, personal digital assistants or smart phones, become indispensable electronic products in the modern life. Most of the existing display devices are liquid crystal display (LCD) devices. The LCD devices have the advantages of thin body, power saving, no radiation and so on, and thus are widely applied. Most of the existing LCD devices on the market are backlight-type LCDs each including a LCD panel and a backlight device. In the LCD panel, liquid crystal molecules are arranged between two parallel transparent substrates, and the light emitted by the backlight device is refracted to produce pictures by controlling the twisting of the liquid crystal molecules. In the conventional technology, the light emitting mode of the backlight device is fixed, reducing the application scope of the display device.

SUMMARY

In view of this, a light emitting panel and a display device are provided in the present disclosure, by which the problem in the conventional technology can be can effectively solved, and the number of light emitting modes of the light emitting panel can be increased, expanding application scope of the display device.

A light emitting panel is provided. The light emitting panel includes a carrier substrate, and multiple connection electrodes, multiple first electrode leads and multiple second electrode leads that are arranged on the carrier substrate. Each of the multiple connection electrodes includes a first sub-connection electrode and a second sub-connection electrode which are isolated from each other. The multiple connection electrodes are divided into a first connection electrode group to an N-th connection electrode group. An i-th connection electrode group includes connection electrodes among the multiple connection electrodes. N is an integer greater than or equal to 2, and i is a positive integer less than or equal to N. First sub-connection electrodes in the i-th connection electrode group are electrically connected with a same first electrode lead among the multiple first electrode leads, and second sub-connection electrodes in the i-th connection electrode group are respectively connected with different second electrode leads among the multiple second electrode leads.

A light emitting panel and a display device are provided in the present disclosure. The light emitting panel includes a carrier substrate, and multiple connection electrodes, multiple first electrode leads and multiple second electrode leads arranged on the carrier substrate. Each connection electrode includes a first sub-connection electrode and a second sub-connection electrode which are isolated from each other. All of the connection electrodes are divided into a first connection electrode group to an N-th connection electrode group. An i-th connection electrode group includes multiple connection electrodes, where N is an integer greater than or equal to 2, and i is a positive integer less than or equal to N. The first sub-connection electrodes in the i-th connection electrode group are electrically connected with the same first electrode lead, and the second sub-connection electrodes in the i-th connection electrode group are respectively connected with different second electrode leads.

In some embodiments, by applying a corresponding driving signal on all of the first electrode leads and all of the second electrode leads, a light emitting mode in which a whole surface of the light emitting panel is lighted can be realized. By applying a driving signal on the first electrode leads and the second electrode leads corresponding to part of the connection electrode groups, a light emitting mode in which a partial region on the light emitting panel is lighted can be realized. Further, by applying a driving signal on the first electrode leads and at least one of the second electrode leads corresponding to part of the connection electrode groups, a light emitting mode in which individual points on the light emitting panel are lighted can be realized. The number of the light emitting modes of the light emitting panel can be increased, and the application scope of the display device can be expanded. In addition, a time sequence in which the driving signal is applied to the first electrode leads and the second electrode leads is optimized, so that the application scope of the display device can be further expanded.

BRIEF DESCRIPTION OF THE DRAWINGS

Embodiments of the present disclosure are shown in the following drawings. It is apparent that the drawings in the following description only show some embodiments of the disclosure.

DETAILED DESCRIPTION

Hereinafter, embodiments of the present disclosure are explained clearly and completely in conjunction with the drawings in the embodiments of the disclosure. It is apparent that the embodiments in the following description are only some embodiments of the present disclosure, rather than all of the embodiments.

As described in the background part, with the increasing development of the communication technology, display devices, such as mobile phones, personal digital assistants or smart phones, become indispensable electronic products in the modern life. Most of the existing display devices are LCD devices. The LCD devices have the advantages of thin body, power saving, no radiation and so on, and thus are widely applied. Most of the existing LCD devices on the market are backlight-type LCDs each including a LCD panel and a backlight device. In the LCD panel, liquid crystal molecules are arranged between two parallel transparent substrates, and the light emitted by the backlight device is refracted to produce pictures by controlling the twisting of the liquid crystal molecules. In the conventional technology, the light emitting mode of the backlight device is fixed, reducing the application scope of the display device.

In view of this, a light emitting panel and a display device are provided according to embodiments of the present disclosure, by which the problem in the conventional technology can be can effectively solved, and the number of light emitting modes of the light emitting panel can be increased, expanding application scope of the display device.

The following solutions are provided according to embodiments of the present disclosure, which are described in detail with reference to FIGS. 1 to 18.

Figure 1:
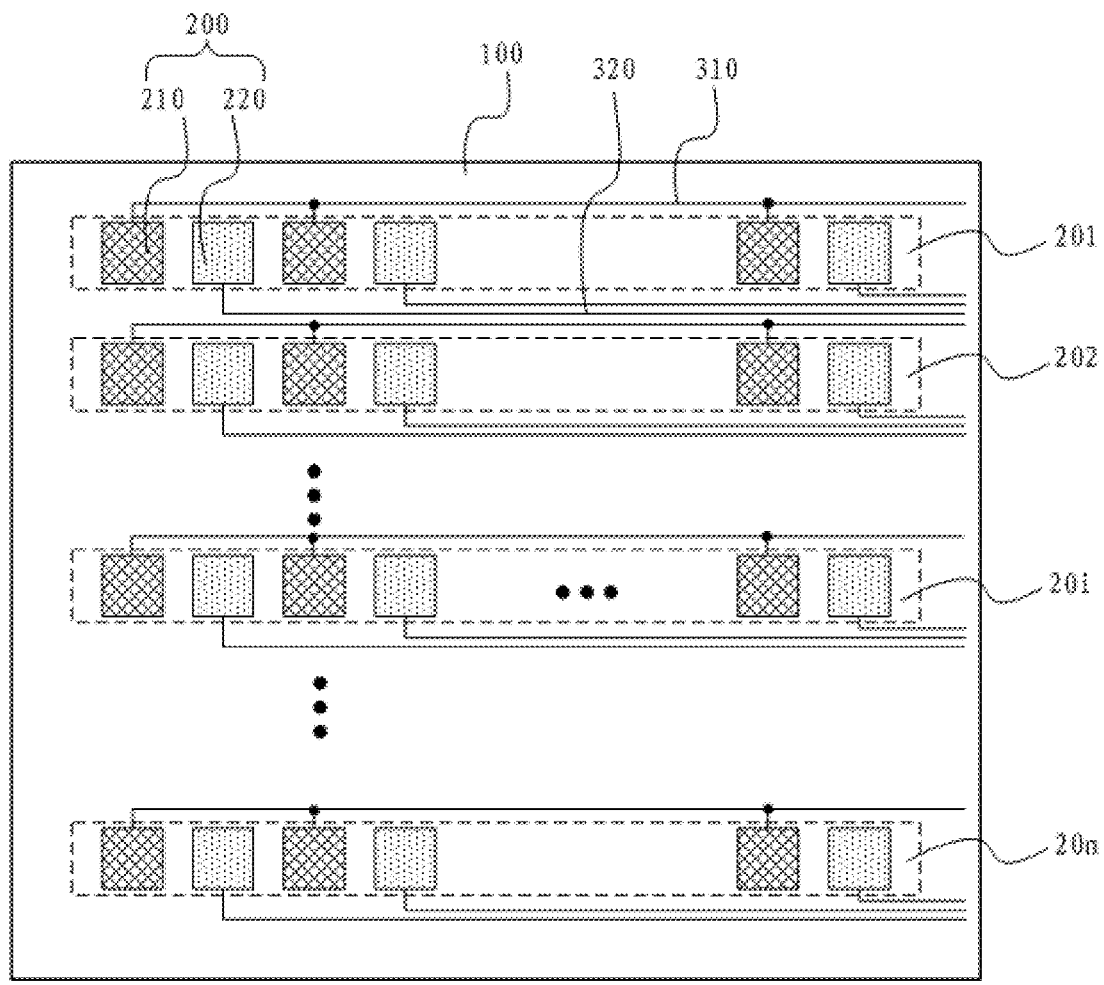
FIG. 1 is a schematic structural diagram of a light emitting panel according to an embodiment of the present disclosure.

Reference is made to FIG. 1, which is a schematic structural diagram of a light emitting panel according to an embodiment of the present disclosure. The light emitting panel includes a carrier substrate 100. The light emitting panel further includes multiple connection electrodes 200, multiple first electrode leads 310 and multiple second electrode leads 320 that are arranged on the carrier substrate 100.

Each of the connection electrodes 200 includes a first sub-connection electrode 210 and a second sub-connection electrode 220 which are isolated from each other, The multiple connection electrodes 200 are divided into a first connection electrode group 201 to an N-th connection electrode group 20n. An i-th connection electrode group 20i includes multiple connection electrodes 200. N is an integer greater than or equal to 2, and i is a positive integer less than or equal to N. First sub-connection electrodes 210 in the i-th connection electrode group 20i are electrically connected with the same first electrode lead 310, and second sub-connection electrodes 220 in the i-th connection electrode group 20i are respectively connected with different second electrode leads 320.

It should be understood that, the first electrode lead and the second electrode lead provided in the embodiment of the present disclosure are used to input a driving signal, to transmit the driving signal to the connection electrode. The driving signal is transmitted to a light emitting element via the connection electrode to drive the light emitting element to emit light. Further, the light emitting element is controlled to emit light having different brightness by controlling a magnitude of the driving signal inputted via the first electrode lead and the second electrode lead. It should be noted that a type of the driving signal provided in the embodiment of the present disclosure is determined based on a type of the light emitting element. For example, if the light emitting element is implemented by a light emitting diode, the driving signal may be a driving current. In this case, the light emitting diode emits light having a corresponding brightness in response to the driving current.

In the embodiment of the present disclosure, by applying a corresponding driving signal on all of the first electrode leads and all of the second electrode leads, a light emitting mode in which a whole surface of the light emitting panel is lighted can be realized. As shown in FIG. 1, by applying a driving signal on all of the first electrode leads 310 and all of the second electrode leads 320, all of the light emitting elements on the light emitting panel can be lighted, realizing the light emitting mode in which a whole surface of the light emitting panel is lighted. By applying a driving signal on the first electrode leads and the second electrode leads corresponding to part of the connection electrode groups, a light emitting mode in which a partial region on the light emitting panel is lighted can be realized. As shown in FIG. 1, by applying a driving signal on the first electrode leads 310 and the second electrode leads 320 corresponding to the first connection electrode group 201 and applying no driving signal on other first electrode leads 310 and other second electrode leads 320, all light emitting elements corresponding to the first connection electrode group can be lighted while remaining regions are dark, realizing the light emitting mode in which a partial region on the light emitting panel is lighted. Further, by applying a driving signal on the first electrode leads and at least one of the second electrode leads corresponding to part of the connection electrode groups, a light emitting mode in which individual points on the light emitting panel are lighted can be realized. For example, by applying a driving signal on the first electrode leads 310 and one of the second electrode leads 320 corresponding to the first connection electrode group 201, only an individual light emitting element corresponding to the first connection electrode group 201 can be lighted, realizing the light emitting mode in which individual points on the light emitting panel are lighted. It can be seen that, with the solution provided in the embodiment of the present disclosure, the number of the light emitting modes of the light emitting panel can be increased, and the application scope of the display device can be expanded. In addition, a time sequence in which the driving signal is applied to the first electrode leads and the second electrode leads is optimized, so that the application scope of the display device can be further expanded.

In an embodiment of the present disclosure, the connection electrodes provided in the present disclosure may be arranged regularly or irregularly. As shown in FIG. 1, the multiple connection electrodes 200 provided in the embodiment of the present disclosure are arranged in an array of N rows by M columns, where an i-th connection electrode row corresponds to the i-th connection electrode group 20$i$, and M is an integer greater than or equal to 2.

Figure 2:
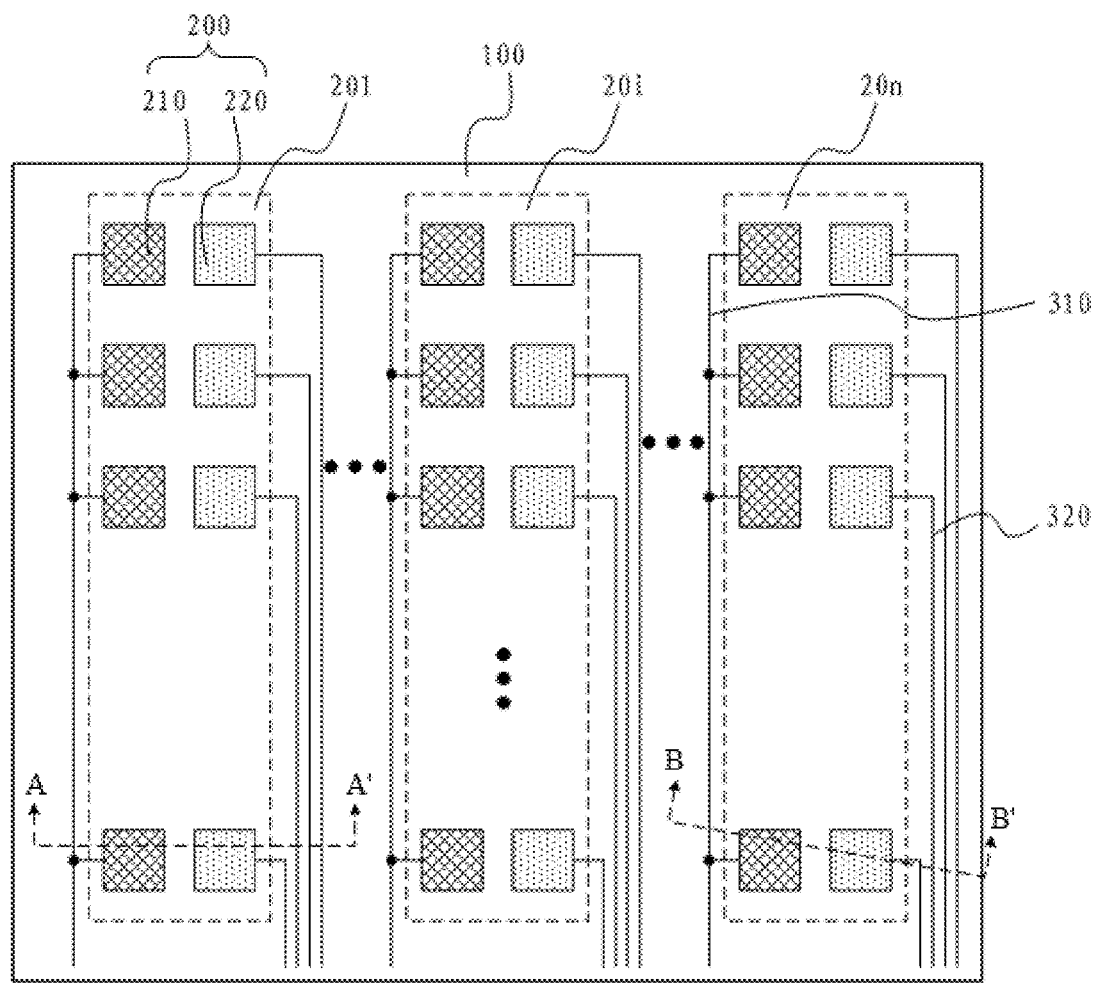
FIG. 2 is a schematic structural diagram of a light emitting panel according to another embodiment of the present disclosure.

In one embodiment, reference is made to FIG. 2, which is a schematic structural diagram of a light emitting panel according to another embodiment of the present disclosure. Multiple connection electrodes 200 are arranged in an array of N columns by M rows, where an i-th connection electrode column corresponds to the i-th connection electrode group 20$i$, and M is an integer greater than or equal to 2.

It may be understood that, the connection electrodes shown in FIG. 1 and FIG. 2 provided in the embodiments of the present disclosure are arranged in a regular array, to optimize the arrangement of the connection electrodes, so that the lines on the carrier substrate are clear in order to perform wiring easily. Further, by optimizing the arrangement of the connection electrodes, the arrangement of the light emitting elements arranged on the connection electrodes and electrically connected with the connection electrodes can be optimized, so that the light emitting elements can be uniformly arranged on the carrier substrate, ensuring that the brightness of light emitted on the whole surface of the light emitting panel is uniform.

It should be noted that, the connection electrodes shown in FIG. 1 and FIG. 2 are arranged in a regular array, which is not limited in the present disclosure. In other embodiments of the present disclosure, the connection electrodes may be arranged in an irregular array. In addition, in the case that the multiple connection electrodes provided in the embodiment of the present disclosure is arranged in an array of multiple rows by multiple columns, each connection electrode group is not limited to a single row or a single column, and may be formed by multiple rows or multiple columns. In one embodiment, the connection electrode group may be formed by part of the connection electrodes in a single row or a single column, or may be formed by part of the connection electrodes in multiple rows or multiple columns, which is not limited in the present disclosure, as long as each connection electrode group includes multiple connection electrodes and different connection electrode groups includes different connection electrodes.

Figure 3:
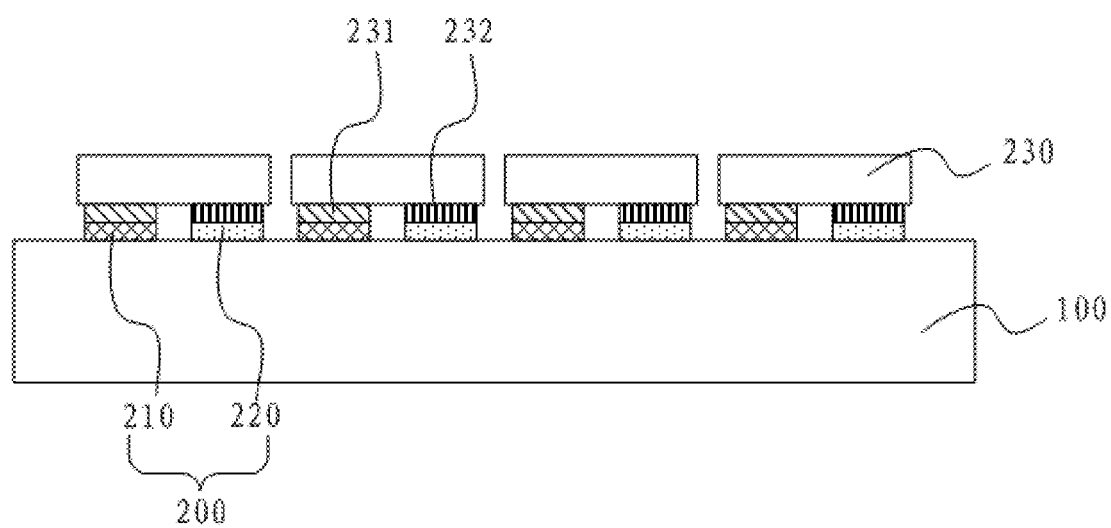
FIG. 3 is a schematic structural diagram of a light emitting panel according to another embodiment of the present disclosure.

Reference is made to FIG. 3, which is a schematic structural diagram of a light emitting panel according to another embodiment of the present disclosure. The light emitting panel provided in the present disclosure includes a light emitting element 230 electrically connected with each connection electrode 200. Two electrodes (a first electrode 231 and a second electrode 232 shown in FIG. 3) in the light emitting element 230 are respectively connected with a first sub-connection electrode 210 and a second sub-connection electrode 220 of the connection electrode 200, so that a driving signal is provided to the light emitting element 230 via the connection electrode 200. In an embodiment, the electrodes of the light emitting element may be fixedly electrically connected with the connection electrode by welding. In other embodiments, the electrodes of the light emitting element may be fixedly electrically connected with the connection electrode in other manners, which is not limited in the present disclosure.

In an embodiment of the present disclosure, the light emitting element may be implemented by a light emitting diode, and the light emitting diode may include a micro light emitting diode. The light emitting diode has advantages of energy saving, environmental protection and fast response and the like. The light emitting panel can implement low power consumption, fast response and the like with the light emitting diode. In an embodiment, the micro light emitting diode provided in the embodiment of the present disclosure includes a Mini-LED, a Micro-LED and the like, which is not limited in the present disclosure. The carrier substrate provided in the embodiment of the present disclosure may be a glass substrate.

Figure 4:
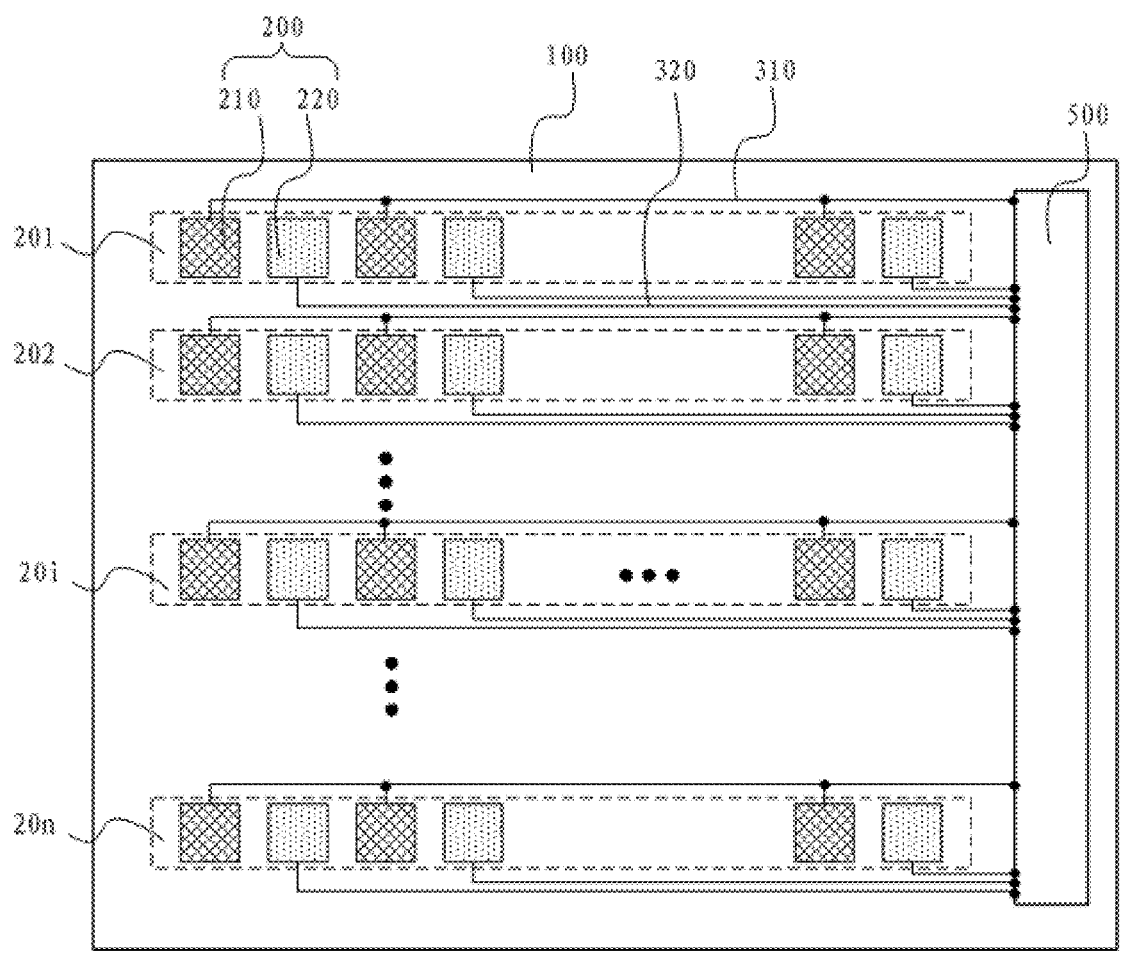
FIG. 4 is a schematic structural diagram of a light emitting panel according to another embodiment of the present disclosure.

In an embodiment of the present disclosure, the element providing the driving signal for the first electrode lead and the second electrode lead may be a driving chip. The driving chip may be directly arranged on the carrier substrate to be electrically connected with the electrode leads. Reference is made to FIG. 4, which is a schematic structural diagram of a light emitting panel according to another embodiment of the present disclosure. The light emitting panel further includes a driving chip 500 fixed on the carrier substrate 100. The driving chip 500 is electrically connected with the first electrode leads 310 and the second electrode leads 320. By fixing the driving chip 500 on the carrier substrate 100, the first electrode leads 310 and the second electrode leads 320 can be directly electrically connected with the driving chip 500 on the carrier substrate 100, simplifying the line connection structure.

Figure 5:
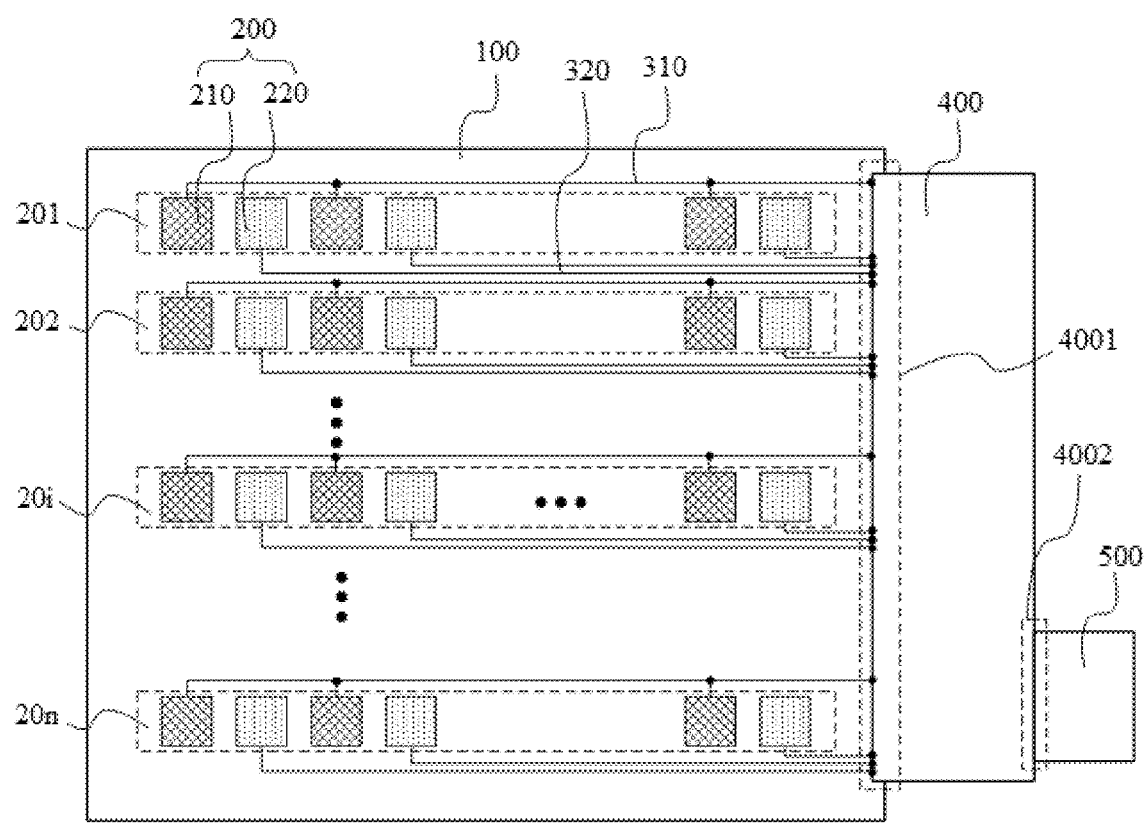
FIG. 5 is a schematic structural diagram of a light emitting panel according to another embodiment of the present disclosure.

In one embodiment, the driving chip provided in the embodiment of the present disclosure may be electrically connected with the first electrode leads and the second electrode leads via a line connection board. Reference is made to FIG. 5, which a schematic structural diagram of a light emitting panel according to another embodiment of the present disclosure. The light emitting panel further includes a line connection board 400 and a driving chip 500. The line connection board 400 includes a first bonding end 4001 and a second bonding end 4002. The first bonding end 4001 is electrically connected with the first electrode leads 310 and the second electrode leads 320. The second bonding end 4002 is electrically connected with the driving chip 500. The driving chip 500 transmits a driving signal to the corresponding first electrode lead 310 and the corresponding second electrode lead 320 via the line connection board 400.

In an embodiment of the present disclosure, the line connection board may be implemented by a flexible circuit board, a printed circuit board or a flex-rigid circuit board, which is not limited in the present disclosure. The line connection board includes the first bonding end and the second bonding end. The first bonding end may include multiple connection pins. The carrier substrate is provided with connection pins to be connected with the first electrode leads and the second electrode leads. In a process that the first bonding end of the line connection board is bonded with the first electrode leads and the second electrode leads, the connection pins of the first bonding end may be bonded with the connection pins respectively connected with the electrode leads by fitting.

The second bonding end provided in the embodiment of the present disclosure may be provided with a structure having multiple pad electrodes. In this case, pins of the driving chip may be directly bonded with the pad electrodes.

In one embodiment, in a case that the driver chip is integrated into another mainboard structure, the second bonding end may be provided with multiple connection pins, and the mainboard is provided with corresponding multiple connection pins. The connection pins of the second bonding end may be bonded with the corresponding connection pins of the mainboard by fitting. The manner of the bonding between the line connection board, the electrode leads and the driving chip is not limited in the embodiments of the present disclosure, which is decided according to the actual applications.

Figure 6:
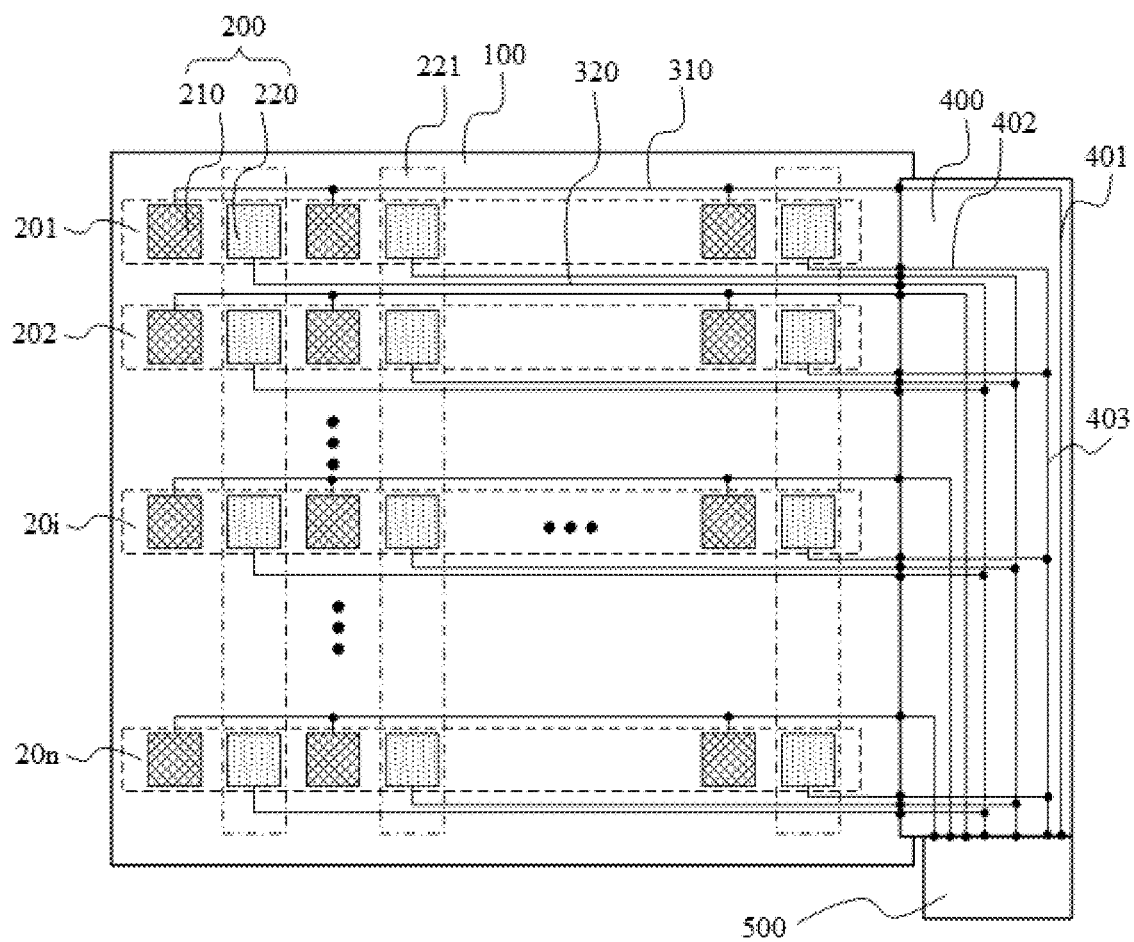
FIG. 6 is a schematic structural diagram of a light emitting panel according to another embodiment of the present disclosure.

The second electrode leads provided in the present disclosure may be mutually independent electrode leads, to facilitate realizing the light emitting mode in which a partial region on the light emitting panel is lighted, the light emitting mode in which individual elements on the light emitting panel are lighted, and the like. In one embodiment, part of the second electrode leads provided in the present disclosure may be electrically connected with each other, to reduce the number of power supply ports of electrode leads and simplify the wiring of the light emitting panel under the condition of realizing the light emitting mode in which a partial region on the light emitting panel is lighted, the light emitting mode in which individual elements on the light emitting panel are lighted, and the like. Reference is made to FIG. 6, which is a schematic structural diagram of a light emitting panel according to another embodiment of the present disclosure. All of the second sub-connection electrodes 220 in the first connection electrode group to the N-th connection electrode group are divided into multiple second sub-connection electrode groups 221. The second sub-connection electrodes 220 in the i-th connection electrode group 20i are respectively in different second sub-connection electrode groups 221, and the second electrode leads 320 respectively electrically connected with the second sub-connection electrodes 220 in each second sub-connection electrode group 221 are connected with each other.

It should be noted that each second sub-connection electrode group provided in the embodiment of the present disclosure may include second sub-connection electrodes respectively from the N connection electrode groups, or may include second sub-connection electrodes respectively from part of the N connection electrode groups. The following description is given by taking the connection electrodes arranged in an array of N rows by M columns shown in FIG. 4 as an example. The second sub-connection electrode group 221 may include all of second sub-connection electrodes 220 in a same column of the first connection electrode group 201 to the N-th connection electrode group 20n. Further, the second sub-connection electrode group may include part of the second sub-connection electrodes in a same column, or may include all or part of second sub-connection electrodes located in different columns, which is not limited in the present disclosure.

It should be understood that, in the embodiment of the present disclosure, all of the second sub-connection electrodes in the first connection electrode group to the N-th connection electrode group are divided into the multiple second sub-connection electrode groups, the second sub-connection electrodes in each second sub-connection electrode group are respectively from different connection electrode groups. The second electrode leads corresponding to each of the second sub-connection electrode groups are connected with each other, so that the light emitting mode in which a partial region on the light emitting panel is lighted and the light emitting mode in which individual elements on the light emitting panel are lighted can be realized, and the number of power supply ports of electrode leads can be reduced.

In an embodiment of the present disclosure, the second electrode leads corresponding to each of the second sub-connection electrode groups may be connected with each other on the line connection board, simplifying the line structure on the carrier substrate, and thus reducing the manufacture cost and manufacture difficulty. As shown in FIG. 6, the line connection board 400 provided in the embodiment of the present disclosure includes multiple first transition lines 401, multiple second transition lines 402 and multiple first connection lines 403. A first end of each of the first transition lines 401 is electrically connected with one of the first electrode leads 310, and a second end of the first transition line 401 is electrically connected with the driving chip 500. A first end of each of the second transition lines 402 is electrically connected with one of the second electrode leads 320, and second ends of the second transition lines 402 corresponding to each of the second sub-connection electrode groups 221 are connected with a same first connection line 403. The first connection lines 403 are electrically connected with the driving chip 500.

Figure 7:
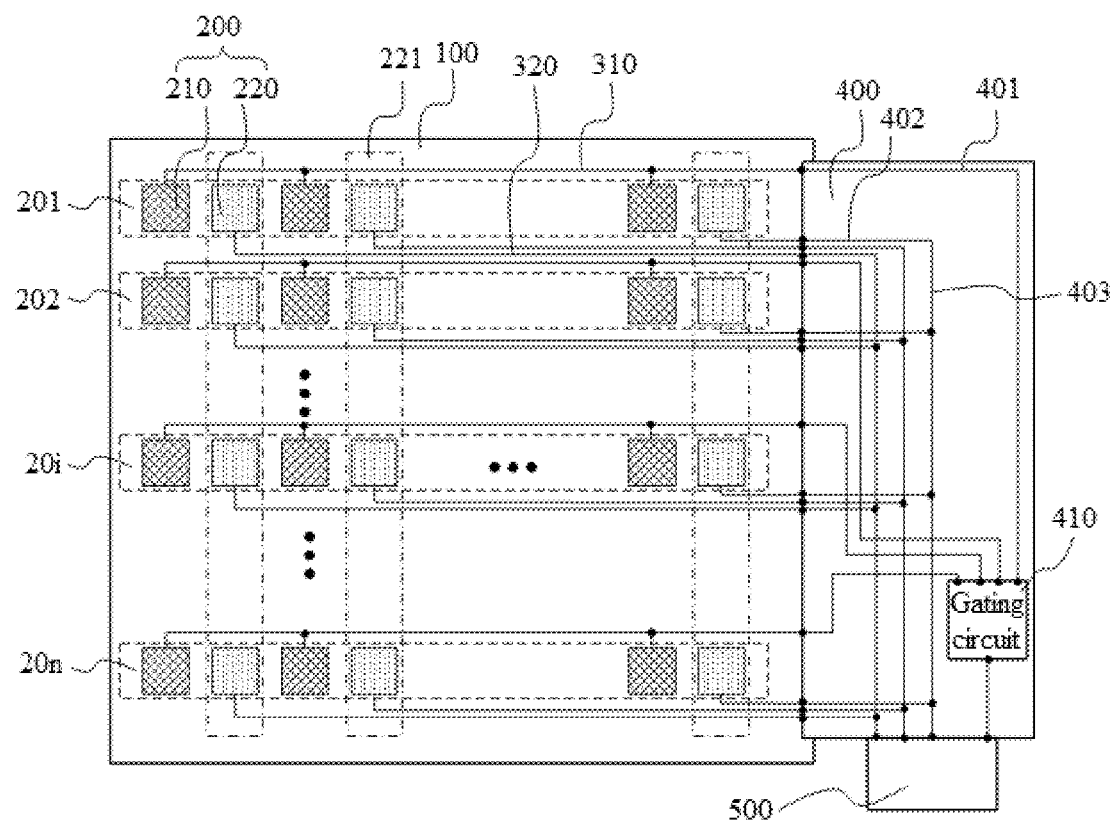
FIG. 7 is a schematic structural diagram of a light emitting panel according to another embodiment of the present disclosure.

The driving chip provided in the embodiment of the present disclosure may directly select a first transition line and transmit the driving signal to the connection electrode via the selected first transition line. Further, in order to improve the processing speed for the driving signal, a gating structure may further be provided to be electrically connected with the driving chip. The driving chip is only used to implement a function of outputting the driving signal, and the first transition line is selected by using the gating structure. The gating structure provided in the embodiment of the present disclosure may be manufactured on the line connection board. Reference is made to FIG. 7, which is a schematic structural diagram of a light emitting panel according to another embodiment of the present disclosure. The light emitting panel further includes a gating circuit 410. An output side of the gating circuit 410 is electrically connected with second ends of all of the first transition lines 401, and an input side of the gating circuit 410 is electrically connected with the driving chip 500. The gating circuit 410 is used to receive the driving signal outputted by the driving chip 500, and transmit the driving signal to the selected first transition line 401.

It should be noted that, the gating circuit provided in the embodiment of the present disclosure may perform logical control by the structure of the gating circuit itself. That is, the driving chip only transmits the corresponding driving signal to the gating circuit, while the gating circuit performs control and selection by the circuit structure of the gating circuit itself to transmit the driving signal to the corresponding first transition line. In one embodiment, the gating circuit may perform logical control by the driving chip. That is, the driving chip not only transmits the corresponding driving signal to the gating circuit, but also transmits the control signal to a control end of the gating circuit. The gating circuit selects the first transition line based on the received control signal to transmit the corresponding driving signal to the selected first transition line.

Figure 8:
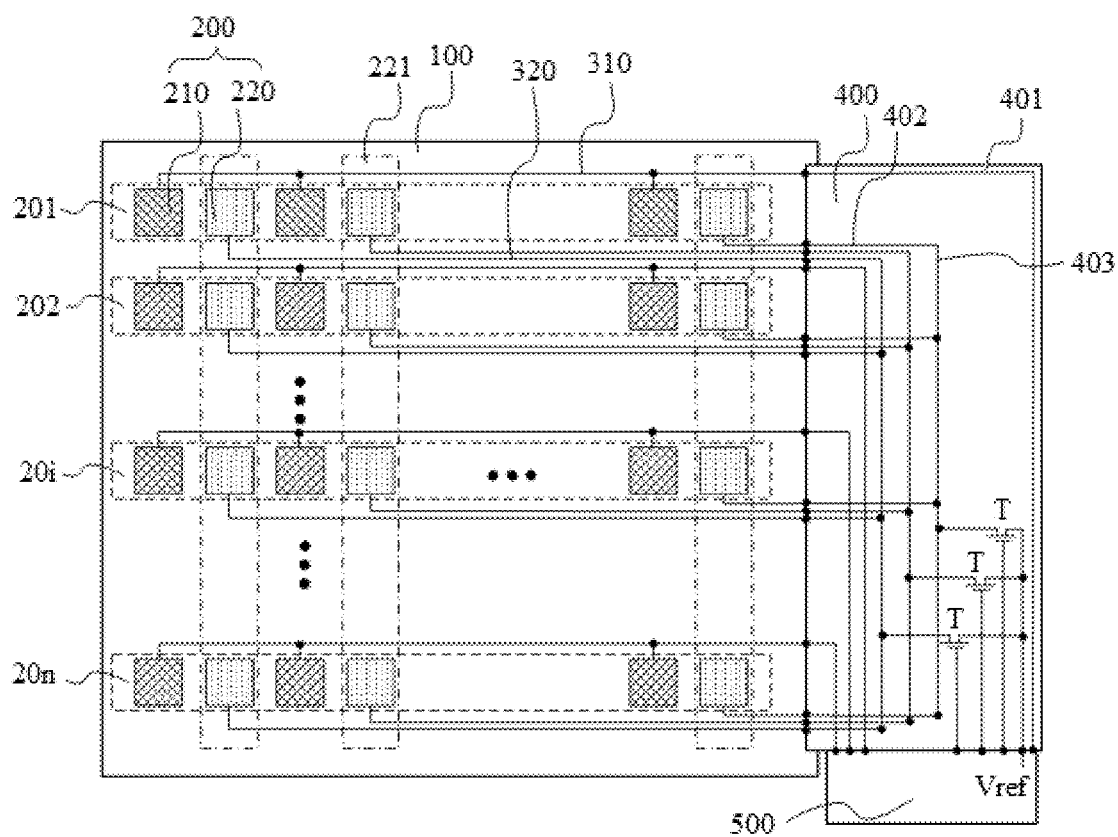
FIG. 8 is a schematic structural diagram of a light emitting panel according to another embodiment of the present disclosure.

In a process that the driving chip provided in the embodiment of the present disclosure transmits the driving signal to the second electrode lead, the driving chip may directly generate a driving signal having a required magnitude to be transmitted to the second electrode lead. In one embodiment, the driving chip provided in the embodiment of the present disclosure may transmit the driving signal having a required magnitude to the second electrode lead by controlling an external circuit structure. Reference is made to FIG. 8, which is a schematic structural diagram of a light emitting panel according to another embodiment of the present disclosure. The light emitting panel further includes multiple driving transistors T. A first end of each of the driving transistors T is electrically connected with one of the first connection lines 403, a second end of the driving transistor T is electrically connected to a reference voltage Vref, and a gate of the driving transistor T is electrically connected with the driving chip 500. The driving chip 500 is used to output a pulse modulation signal to the gate of the driving transistor T. The pulse modulation signal outputted by the driver chip 500 is inputted to the gate of the driving transistor T, so that a first connection line for which the driving signal is outputted can be selected by the pulse modulation signal. Further, a magnitude of the driving signal finally outputted by the driving transistor is modulated by a pulse width of the pulse modulation signal, to control the brightness of light emitted by the light emitting element electrically connected with the connection electrode.

Figure 9:
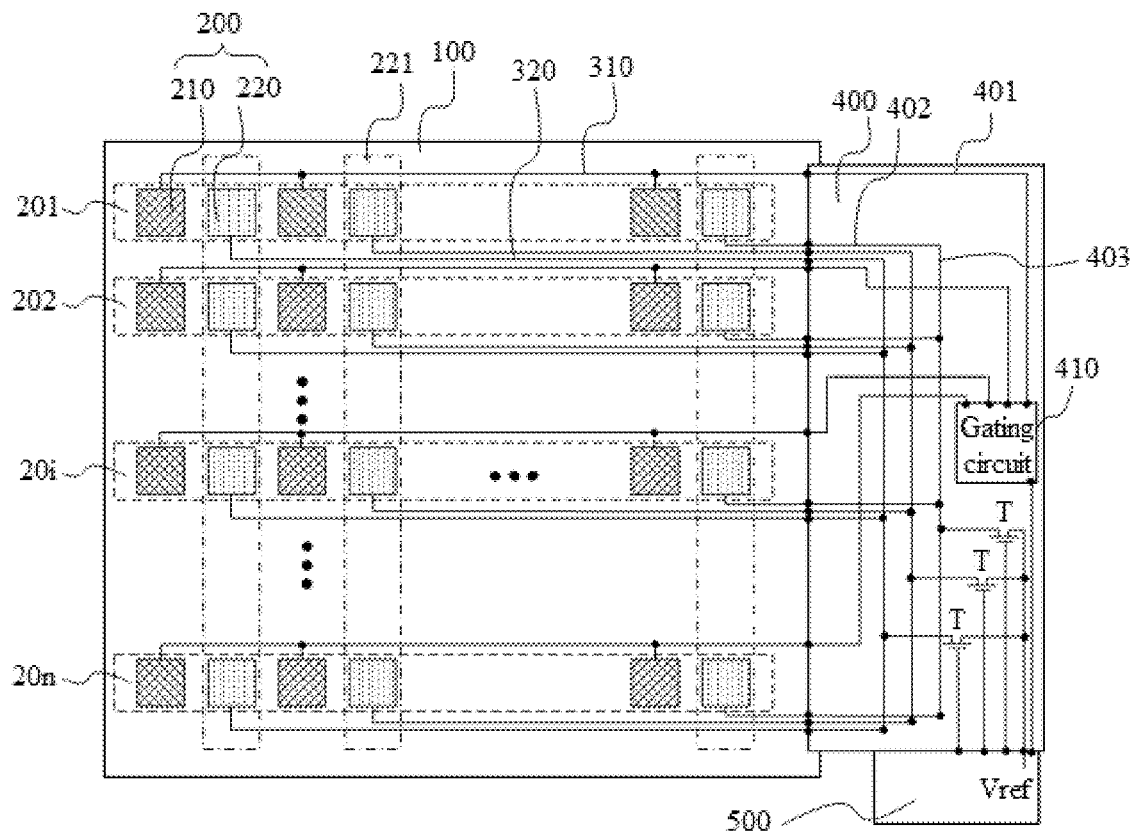
FIG. 9 is a schematic structural diagram of a light emitting panel according to another embodiment of the present disclosure.

In an embodiment of the present disclosure, the light emitting panel provided in the present disclosure may include the gating circuit (as shown in FIG. 7), or the light emitting panel, may include the driving transistors (as shown in FIG. 8), or the light emitting panel may include both the gating circuit and the driving transistors, which is decided according to the actual applications. Reference is made to FIG. 9, which is a schematic structural diagram of a light emitting panel according to another embodiment of the present disclosure. The light emitting panel may include both the gating circuit 410 and the driving transistors T. In a process that all of the light emitting elements on the light emitting panel are lighted, the gating circuit 410 selects all of the first transition lines 401 for which the driving signal is outputted, and the driving chip 500 controls all of the driving transistors T to be turned on to transmit the driving signal to all of the first connection lines 403. The light emitting elements respectively electrically connected with all of the connection electrodes 200 on the light emitting panel are driven to emit light by the driving signal on the first transition lines 401 and the driving signal on the first connection lines 403. Further, the brightness of the light emitted by the light emitting element is controlled by a pulse width of the pulse modulation signal outputted by the driver chip 500.

As shown in FIG. 9, in a process that the light emitting elements on a partial region of the light emitting panel are lighted, the gating circuit 410 selects part of the first transition lines 401 for which the driving signal is outputted, and the driving chip 500 controls corresponding part of the driving transistors T to be turned on to transmit the driving signal to the corresponding first connection lines 403. The light emitting elements on a desired region of the light emitting panel are driven to emit light by the driving signal on the first transition lines 401 and the driving signal on the first connection lines 403. Further, the brightness of the light emitted by the light emitting element is controlled by a pulse width of the pulse modulation signal outputted by the driver chip 500.

As shown in FIG. 9, in a process that an individual light emitting element on the light emitting panel is lighted, the gating circuit 410 selects one of the first transition lines 401 for which the driving signal is outputted, and the driving chip 500 controls a corresponding driving transistor T to be turned on to transmit the driving signal to a corresponding first connection line 403. A predetermined light emitting element on the light emitting panel is driven to emit light by the driving signal on the first transition line 401 and the driving signal on the first connection line 403. Further, the brightness of the light emitted by the light emitting element is controlled by a pulse width of the pulse modulation signal outputted by the driver chip 500.

In any one of the above embodiments of the present disclosure, at least one of the first transition lines does not overlap with at least one of the second transition lines, and/or at least one of the first transition lines does not overlap with at least one of the first connection lines. By optimizing the arrangement of the first transition lines, the second transition lines and the first connection lines, the number of overlapping points of the first transition lines with the second transition lines and the first connection lines is reduced, decreasing the capacitance formed at the overlap points, ensuring that signals transmitted on the first transition lines, the second transition lines and the first connection lines have a little interference on each other.

Figure 10:
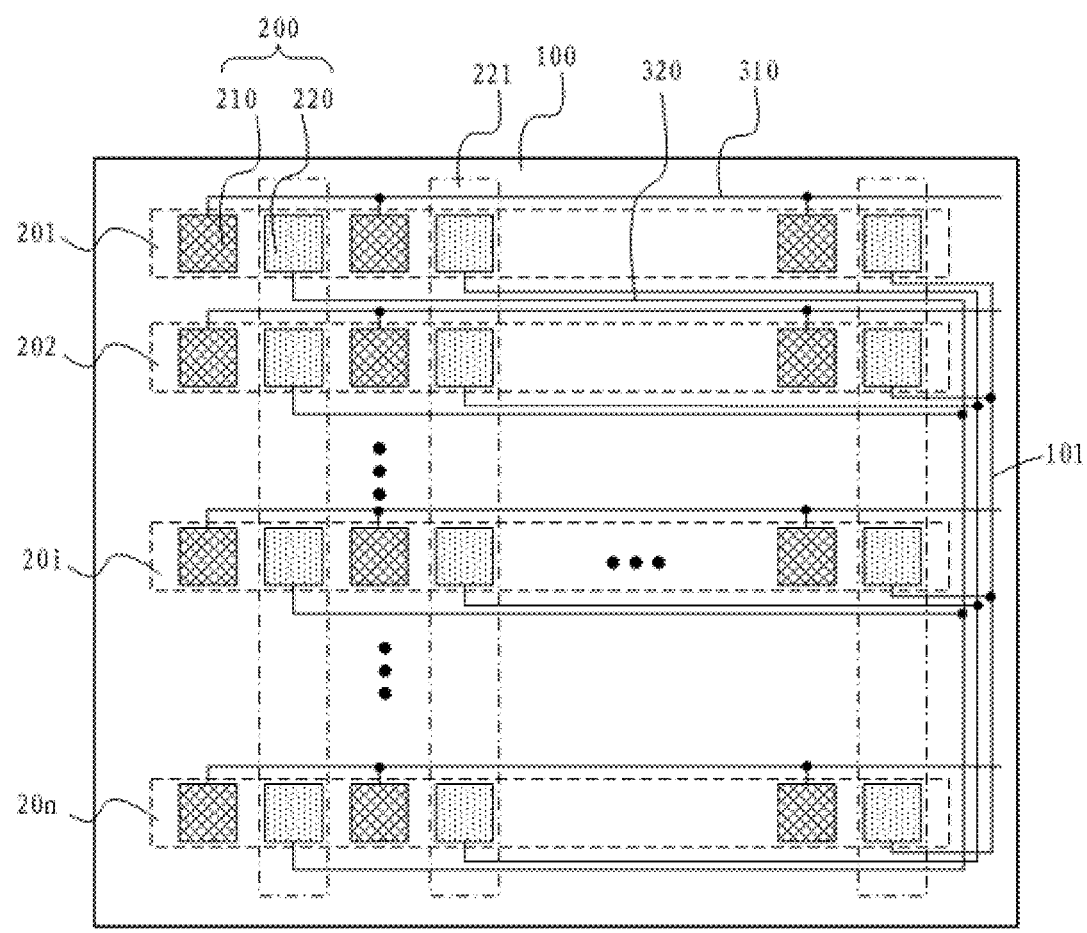
FIG. 10 is a schematic structural diagram of a light emitting panel according to another embodiment of the present disclosure.

In the embodiment of the present disclosure, the second electrode leads corresponding to each of the second sub-connection electrode groups may be connected with each other on the line connection board. In addition, the second electrode leads corresponding to each of the second sub-connection electrode groups may be connected with each other on the carrier substrate. Reference is made to FIG. 10, which is a schematic structural diagram of a light emitting panel according to another embodiment of the present disclosure. All of the second sub-connection electrodes 220 in the first connection electrode group to the N-th connection electrode group are divided into multiple second sub-connection electrode groups 221. The second sub-connection electrodes 220 in the i-th connection electrode group 20*i* are respectively in different second sub-connection electrode groups 221, and the second electrode leads 320 respectively electrically connected with the second sub-connection electrodes 220 in each second sub-connection electrode group 221 are connected with each other. The second electrode leads 320 connected with each other provided in the embodiment of the present disclosure may be connected with each other by a second connection line provided on the carrier substrate 100. As shown in FIG. 10, the light emitting panel further includes multiple second connection lines 101 provided on the carrier substrate 100. The second electrode leads 320 corresponding to each of the second sub-connection electrode groups 221 are connected with the same second connection line 101.

Figure 11:
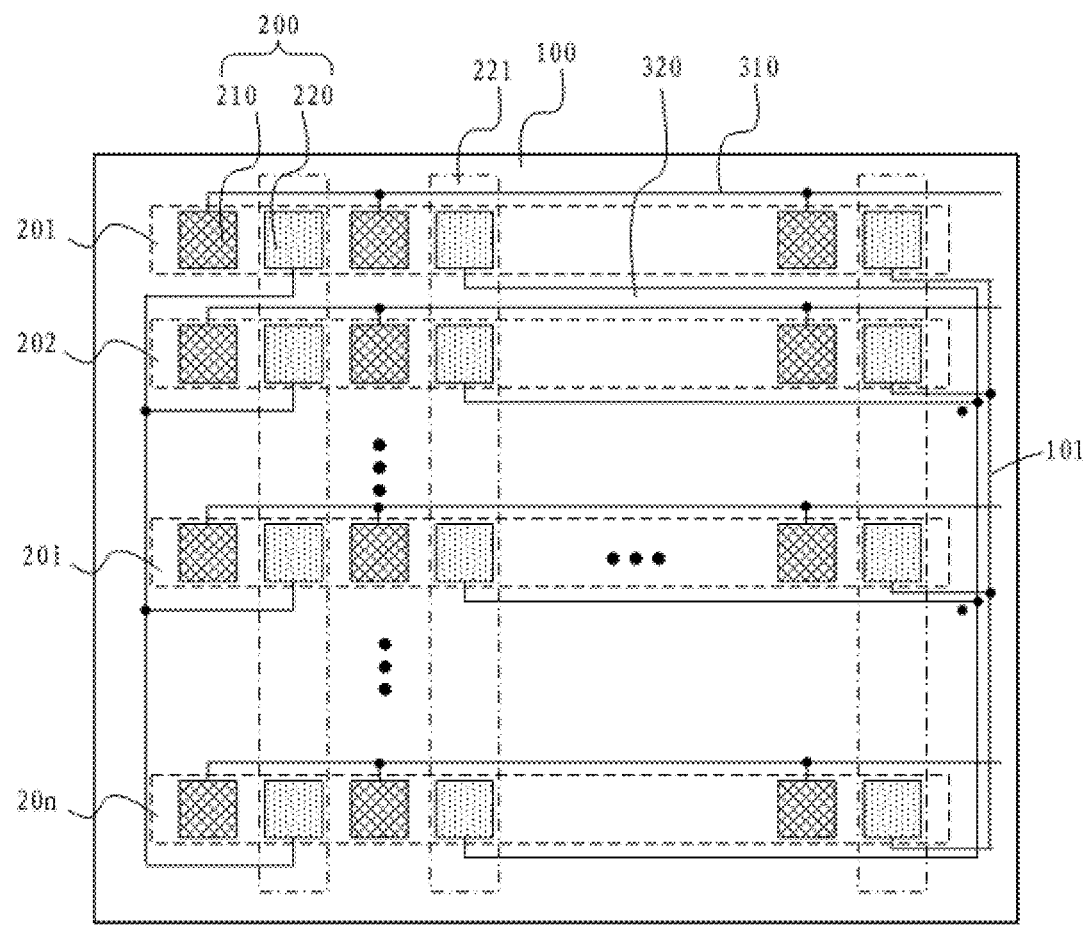
FIG. 11 is a schematic structural diagram of a light emitting panel according to another embodiment of the present disclosure.

As shown in FIG. 10, the second connection lines 101 provided in the embodiment of the present disclosure may be arranged on a same side of the carrier substrate 100. In one embodiment, as shown in FIG. 11, the second connection lines 101 provided in the embodiment of the present disclosure may be divided in groups. The second connection lines in different groups are arranged on different sides of the carrier substrate 100, decreasing a frame area of the light emitting panel, to meet the design of narrow frame of the light emitting panel. The narrow frame of the light emitting panel may be implemented in other manners in other embodiments of the present disclosure, which is not limited in the present disclosure.

Figure 12:
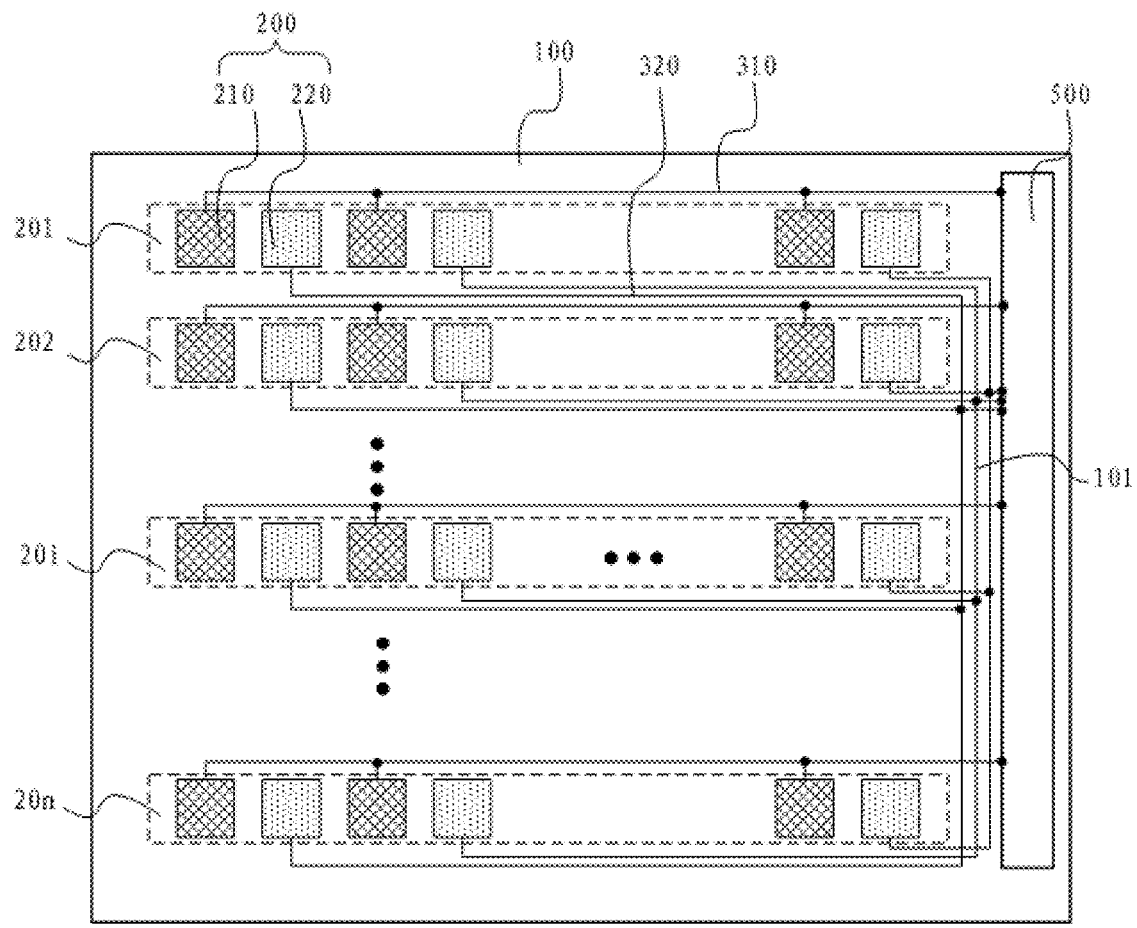
FIG. 12 is a schematic structural diagram of a light emitting panel according to another embodiment of the present disclosure.

As shown in FIG. 12, the element providing the driving signal for the first electrode lead 310 and the second electrode lead 320 may be a driving chip 500. The driving chip 500 may be directly arranged on the carrier substrate 100. The driving chip 500 is electrically connected with the first electrode leads 310 and the second connection lines 101. By fixing driving chip 500 on the carrier substrate 100, the first electrode leads 310 and the second connection lines 101 can be directly electrically connected with the driving chip 500 on the carrier substrate 100, simplifying the line connection structure.

Figure 13:
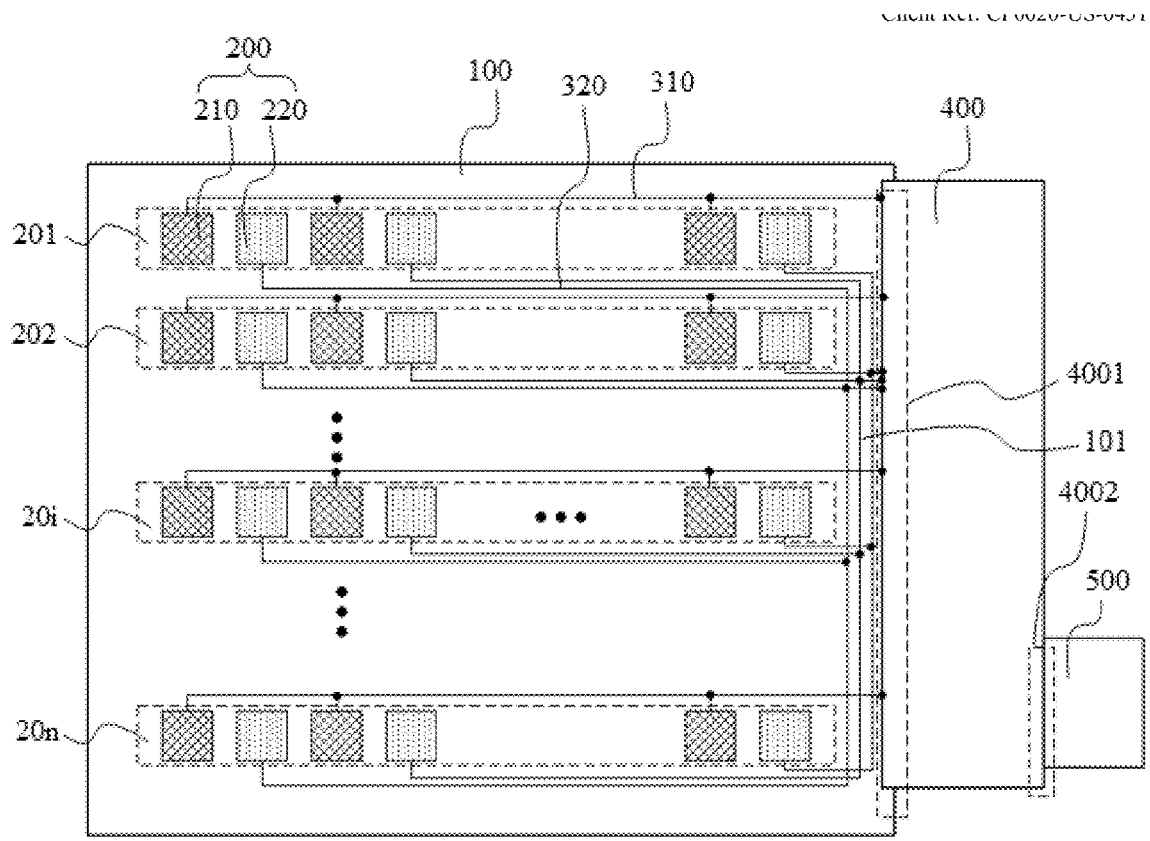
FIG. 13 is a schematic structural diagram of a light emitting panel according to another embodiment of the present disclosure.

In one embodiment, as shown in FIG. 13, the driving chip 500 provided in the embodiment of the present disclosure may be electrically connected with the first electrode leads 310 and the second connection lines 101 via a line connection board 400. In the case that the light emitting panel according to the embodiment of the present disclosure includes the line connection board 400 and the driving chip 500, the line connection board 400 includes a first bonding end 4001 and a second bonding end 4002. The first bonding end 4001 is electrically connected with the first electrode leads 310 and the second connection lines 101. The second bonding end 4002 is electrically connected with the driving chip 500. The driving chip 500 transmits a driving signal to the corresponding first electrode lead 310 and the corresponding second electrode lead 320 via the line connection board 400.

In a case that the second connection lines provided in embodiment of the present disclosure is provided on the carrier substrate, the light emitting panel may further include a gating circuit and/or driving transistors. The gating circuit may be directly connected with the first electrode leads and is arranged on the carrier substrate. The driving transistors may be respectively directly connected with the second connection lines and are arranged on the carrier substrate, which is not limited in the present disclosure. It should be noted that, no matter whether the gating circuit and the driving transistors provided in the embodiment of the present disclosure are arranged on the line connection board or the carrier substrate, the gating circuit and the driving transistors may be arranged on the line connection board or the carrier substrate by bonding, or in other manners in other embodiments of the present disclosure, which is not limited in the present disclosure.

Figure 14:
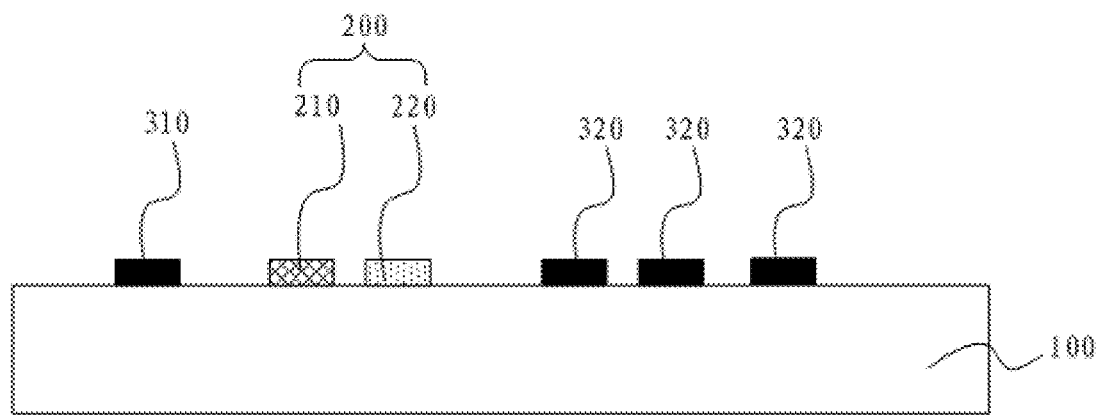
FIG. 14 is a schematic structural diagram of a light emitting panel according to another embodiment of the present disclosure.

The connection electrode, the first electrode lead and the second electrode lead may be arranged on a same side or different sides of the carrier substrate. In a case that the connection electrode, the first electrode lead and the second electrode lead are arranged on the same side of the carrier substrate, the connection electrode, the first electrode lead and the second electrode lead are arranged in different conductive layers, or one of the connection electrode, the first electrode lead and the second electrode lead is arranged in a conductive layer different from a conductive layer in which the other two of the connection electrode, the first electrode lead and the second electrode lead are arranged. In one embodiment, the connection electrode, the first electrode lead and the second electrode lead may be arranged on a same side of the carrier substrate and in a same layer, reducing the thickness of the line structure on the carrier substrate and the manufacture difficulty. Further, a light emitting efficiency of the light emitting panel can be improved by the reflection of the first electrode lead and the second electrode lead. Reference is made to FIG. 14, which is a schematic structural diagram of a light emitting panel according to another embodiment of the present disclosure. FIG. 14 is a sectional view taken along a line AA' in FIG. 2. The connection electrode 200, the first electrode lead 310 and the second electrode lead 320 are arranged on a same side of the carrier substrate 100 and arranged in a same layer.

Figure 15:
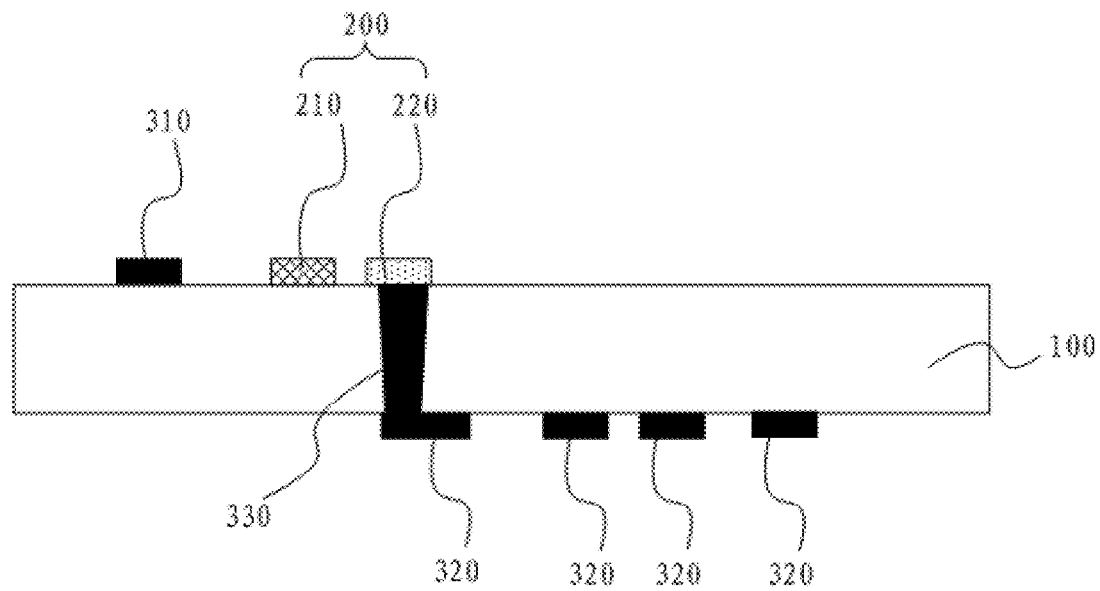
FIG. 15 is a schematic structural diagram of a light emitting panel according to another embodiment of the present disclosure.

In one embodiment, reference is made to FIG. 15, which is a schematic structural diagram of a light emitting panel according to another embodiment of the present disclosure. FIG. 15 is a sectional view taken along a line BB' in FIG. 2. The connection electrode 200 and one (taking the first electrode lead 310 as an example) of the first electrode lead 310 and the second electrode lead 320 are arranged on a same side of the carrier substrate 100 and arranged in a same layer. The other (taking the second electrode lead 320 as an example) of the first electrode lead 310 and the second electrode lead 320 is arranged on a side of the carrier substrate 100 facing away from the connection electrode 200. The other (which is the second electrode lead 320 herein) of the first electrode lead 310 and the second electrode lead 320 is electrically connected with the connection electrode 200 via a via-hole 330.

It should be understood that, the first electrode lead is a lead connected with the first sub-connection electrode, and the second electrode lead is a lead connected with the second sub-connection electrode. The first electrode lead and the second electrode lead may be arranged on a same side or different sides of the carrier substrate. No matter whether the connection electrode, the first electrode lead and the second electrode lead are arranged on the same side of the carrier substrate, lines on any side of the carrier substrate are arranged in a same layer. That is, the surface on any one side of the carrier substrate is a single-layer electrode pattern. The single-layer electrode pattern may be formed by processes such as a printing process, an evaporation and etching process.

Figure 16:
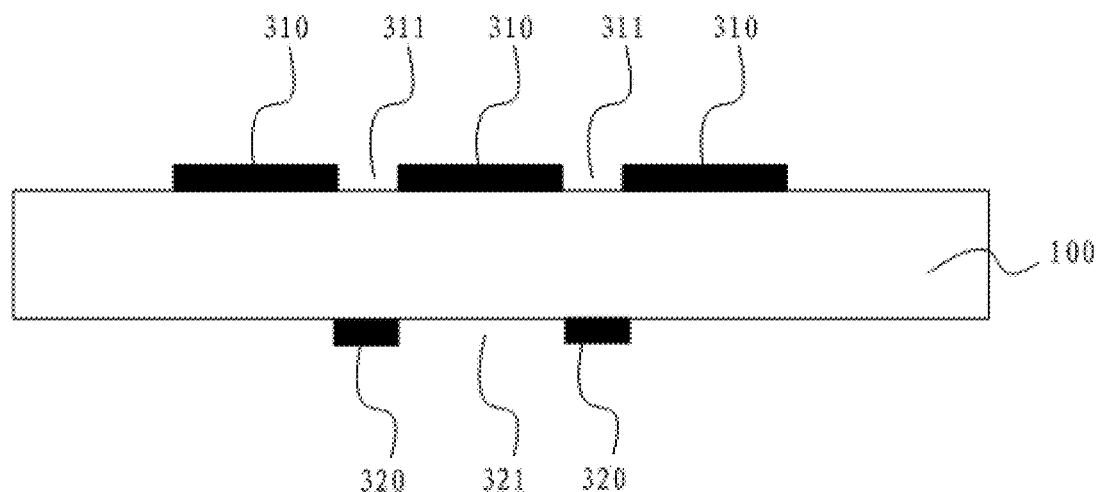
FIG. 16 is a schematic structural diagram of a light emitting panel according to another embodiment of the present disclosure.

Reference is made to FIG. 16, which is a schematic structural diagram of a light emitting panel according to another embodiment of the present disclosure. In the case that the first electrode lead 310 and the second electrode lead 320 are respectively arranged on opposite sides of the carrier substrate 100, at least one first electrode leads 310 is opposite to a first gap 321 between adjacent second electrode leads 320, and the first electrode lead 310 covers the first gap 321, and/or at least one second electrode lead 320 is opposite to a second gap 311 between adjacent first electrode leads 310, and the second electrode lead 320 covers the second gap 311.

It should be understood that the first electrode lead and/or the second electrode lead provided in the embodiment of the present disclosure has a reflection performance. In the case that the first electrode lead and the second electrode lead are respectively arranged on the opposite sides of the carrier substrate, one kind of electrode leads cover gaps formed between the other kind of electrode leads, expanding reflection areas of the electrode leads, and further improving the light emitting efficiency of the light emitting surface. In an embodiment, the connection electrode, the first electrode lead and the second electrode lead provided in the embodiment of the present disclosure are made of metal materials, improving the light emitting efficiency of the light emitting panel by means of the reflection performance of the metal materials. The metal materials may include silver, copper, aluminum and so on.

It should be noted that, the location distribution of the connection electrode and the electrode lead is not limited in the present disclosure. For example, in other embodiments of the present, the first electrode lead and the second electrode lead may be arranged on a same side of the carrier substrate and arranged in a same layer, and the connection electrode is arranged on the other side of the carrier substrate. The first electrode lead and the second electrode lead are connected with the connection electrode via a via-hole on the carrier substrate.

Figure 17:
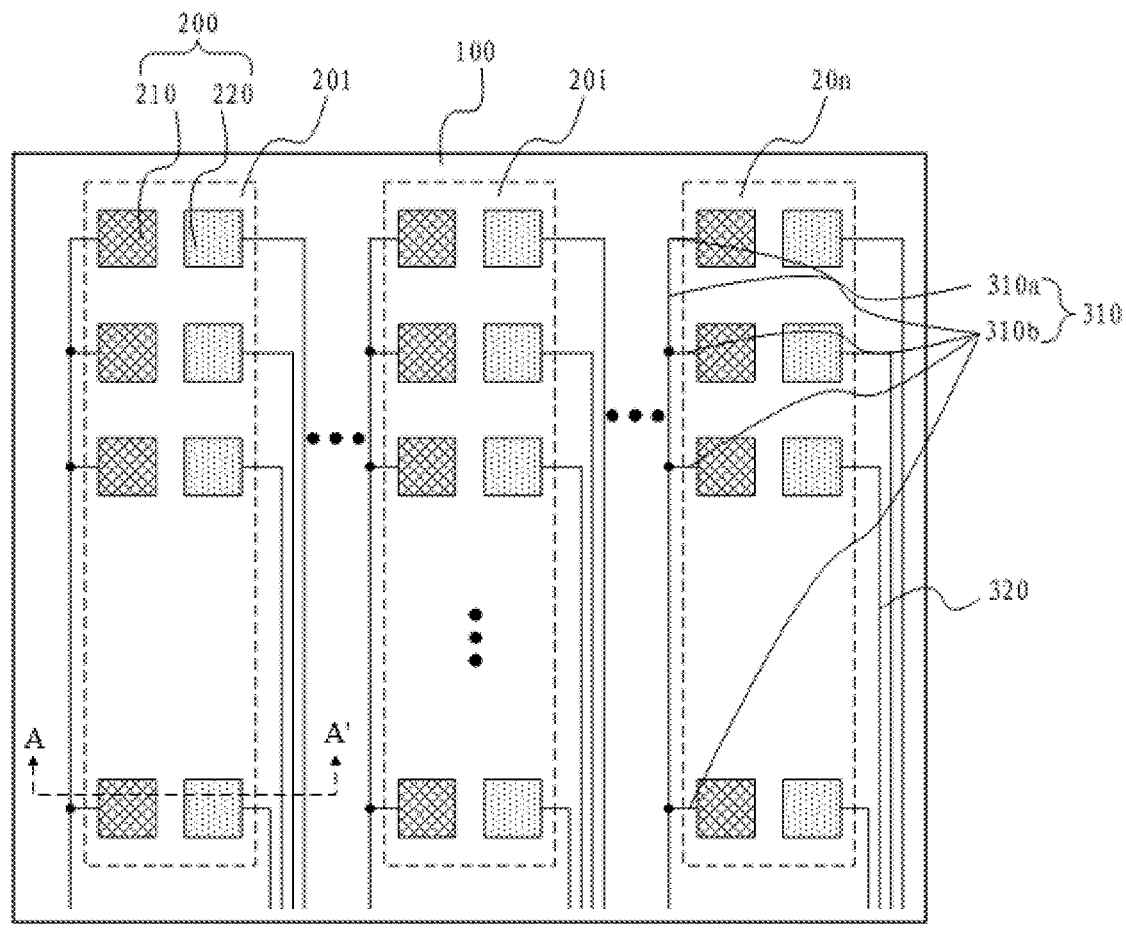
FIG. 17 is a schematic structural diagram of a light emitting panel according to another embodiment of the present disclosure.

The first electrode lead provided in the embodiment of the present disclosure is connected with multiple first sub-connection electrodes. In this case, the first electrode lead may include a main electrode lead and multiple lead-out electrode leads. Each of the lead-out electrode leads is connected with one of the first sub-connection electrodes, and lead-out electrode leads of the first electrode lead are connected with the main electrode lead of the first electrode lead, so that the first electrode lead can be connected with all of the first sub-connection electrodes in the corresponding connection electrode group. Reference is made to FIG. 17, which is a schematic structural diagram of a light emitting panel according to another embodiment of the present disclosure. The first electrode lead 310 includes a main electrode lead 310*a* and multiple lead-out electrode leads 310*b*. The lead-out electrode leads 310*b* are respectively connected with the first sub-connection electrodes 210. The lead-out electrode leads 310*b* are connected with the main electrode lead 310*a*, so that the first electrode lead 310 can be connected with the first sub-connection electrodes 210. In an embodiment, the main electrode lead and the lead-out electrode lead of the first electrode lead are arranged in a same layer.

In any one of the above embodiments of the present disclosure, a thickness of the first electrode lead, a thickness of the second electrode lead and a thickness of the connection electrode each are greater than or equal to 1 µm and less than or equal to 10 µm. In an embodiment, the thickness of the first electrode lead, the thickness of the second electrode lead and the thickness of the connection electrode each may be 5 µm.

One of the first sub-connection electrode and the second sub-connection electrode provided in the present disclosure is a positive electrode, and the other of the first sub-connection electrode and the second sub-connection electrode is a negative electrode. Among the first electrode leads and the second electrode leads, a line width of at least one electrode lead connected with the positive electrode is greater than a line width of an electrode lead connected with the negative electrode. In an embodiment of the present disclosure, the first sub-connection electrode is provided as the positive electrode, and the second sub-connection electrode is provided as the negative electrode. Since a current flowing through the first electrode lead is larger than a current flowing through the second electrode lead, the first electrode lead is made to have a wider line width than the second electrode lead, which can improve tolerance for the current flowing through the first electrode lead. Further, by making the first electrode lead to have a large width, the resistance of the first electrode lead can be reduced, reducing the power consumption of the light emitting panel. The line widths of the first electrode lead and the second electrode lead may be determined based on the comparison between the currents respectively flowing through the first electrode lead and the second electrode lead, which is not limited in the present disclosure.

In one embodiment, a display device is further provided in the present disclosure. The display device includes the light emitting panel according to any one of above embodiments.

Figure 18:
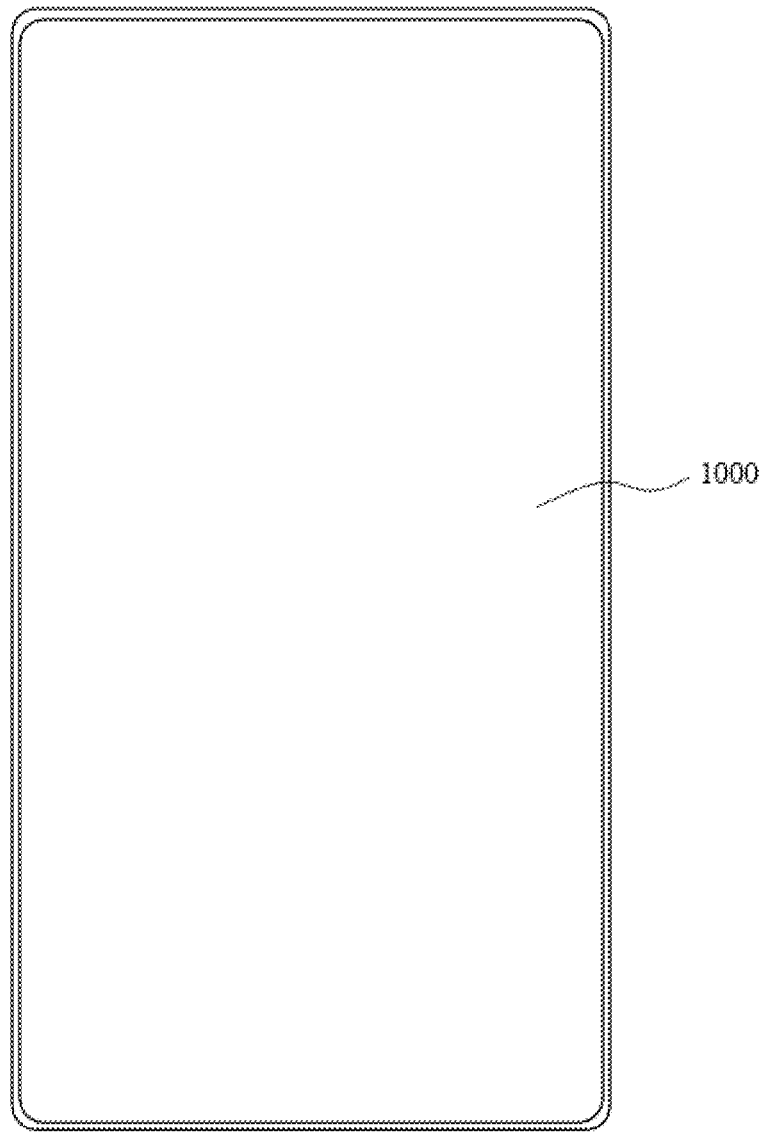
FIG. 18 is a schematic structural diagram of a display device according to an embodiment of the present disclosure.

Reference is made to FIG. 18, which is a schematic structural diagram of a display device according to an embodiment of the present disclosure. A display device 1000 according to the embodiment of the present disclosure includes the light emitting panel according to any one of above embodiments. The display device 1000 may be a mobile terminal.

It should be noted that the display device according to the embodiment of the present disclosure may be not only the mobile terminal, but also a computer, a tablet, a wearable device and the like. The light emitting panel included in the display device according to the embodiment of the present disclosure may be used as a display panel in the display device, and may also be used as a backlight substrate in a backlight source in the display device, which is not limited in the present disclosure.

A light emitting panel and a display device are provided according to the embodiments of the present disclosure. The light emitting panel includes a carrier substrate, and multiple connection electrodes, multiple first electrode leads and multiple second electrode leads arranged on the carrier substrate. Each connection electrode includes a first sub-connection electrode and a second sub-connection electrode which are isolated from each other. All of the connection electrodes are divided into a first connection electrode group to an N-th connection electrode group. An i-th connection electrode group includes multiple connection electrodes, where N is an integer greater than or equal to 2, and i is a positive integer less than or equal to N. The first sub-connection electrodes in the i-th connection electrode group are electrically connected with the same first electrode lead, and the second sub-connection electrodes in the i-th connection electrode group are respectively connected with different second electrode leads.

It can be seen from the above that, with the solutions provided in the embodiments of the present disclosure, by applying a corresponding driving signal on all of the first electrode leads and all of the second electrode leads, a light emitting mode in which a whole surface of the light emitting panel is lighted can be realized. By applying a driving signal on the first electrode leads and the second electrode leads corresponding to part of the connection electrode groups, a light emitting mode in which a partial region on the light emitting panel is lighted can be realized. Further, by applying a driving signal on the first electrode leads and at least one of the second electrode leads corresponding to part of the connection electrode groups, a light emitting mode in which individual points on the light emitting panel are lighted can be realized. It can be seen that, with the solution provided in the embodiment of the present disclosure, the number of the light emitting modes of the light emitting panel can be increased, and the application scope of the display device can be expanded. In addition, a time sequence in which the driving signal is applied to the first electrode leads and the second electrode leads is optimized, so that the application scope of the display device can be further expanded.

What is claimed is:

1. A light emitting panel, comprising:
   a carrier substrate; and
   a plurality of connection electrodes, a plurality of first electrode leads and a plurality of second electrode leads that are arranged on the carrier substrate, wherein
   each of the plurality of connection electrodes comprises a first sub-connection electrode and a second sub-connection electrode which are isolated from each other,
   the plurality of connection electrodes are divided into a first connection electrode group to an N-th connection electrode group, and an i-th connection electrode group comprises connection electrodes among the plurality of connection electrodes, N is an integer greater than or equal to 2, and i is a positive integer less than or equal to N; and
   first sub-connection electrodes in the i-th connection electrode group are electrically connected with a same first electrode lead among the plurality of first electrode leads, and second sub-connection electrodes in the i-th connection electrode group are respectively connected with different second electrode leads among the plurality of second electrode leads.

2. The light emitting panel according to claim 1, further comprising:
a line connection board comprising a first bonding end and a second bonding end; and
a driving chip, wherein
the first bonding end is electrically connected with the plurality of first electrode leads and the plurality of second electrode leads; and
the second bonding end is electrically connected with the driving chip; and
the driving chip is configured to transmit a driving signal to a first electrode lead among the plurality of first electrode leads corresponding the driving signal and a second electrode lead among the plurality of second electrode leads corresponding the driving signal via the line connection board.

3. The light emitting panel according to claim 2, wherein second sub-connection electrodes in the first connection electrode group to the N-th connection electrode group are divided into a plurality of second sub-connection electrode groups, the second sub-connection electrodes in the i-th connection electrode group are respectively in different second sub-connection electrode groups among the plurality of second sub-connection electrode groups, and the second electrode leads respectively electrically connected with the second sub-connection electrodes in each of the plurality of second sub-connection electrode groups are connected with each other.

4. The light emitting panel according to claim 3, wherein the line connection board comprises a plurality of first transition lines, a plurality of second transition lines and a plurality of first connection lines, wherein
a first end of each of the plurality of first transition lines is electrically connected with one of the plurality of first electrode leads, and a second end of the first transition line is electrically connected with the driving chip; and
a first end of each of the plurality of second transition lines is electrically connected with one of the plurality of second electrode leads, and second ends of second transition lines among the plurality of second transition lines corresponding to each of the plurality of second sub-connection electrode groups are connected with a same first connection line among the plurality of first connection lines, and each of the plurality of first connection lines is electrically connected with the driving chip.

5. The light emitting panel according to claim 4, further comprising:
a gating circuit, wherein
an output side of the gating circuit is electrically connected with second ends of the plurality of first transition lines, and an input side of the gating circuit is electrically connected with the driving chip.

6. The light emitting panel according to claim 4, further comprising:
a plurality of driving transistors, wherein
a first terminal of each of the plurality of driving transistors is electrically connected with one of the plurality of first connection lines, a second terminal of the driving transistor is electrically connected to a reference voltage, and a gate of the driving transistor is electrically connected with the driving chip, wherein the driving chip is arranged to output a pulse modulation signal to the gate of the driving transistor.

7. The light emitting panel according to claim 5, further comprising:
a plurality of driving transistors, wherein
a first terminal of each of the plurality of driving transistors is electrically connected with one of the plurality of first connection lines, a second terminal of the driving transistor is electrically connected to a reference voltage, and a gate of the driving transistor is electrically connected with the driving chip, wherein the driving chip is arranged to output a pulse modulation signal to the gate of the driving transistor.

8. The light emitting panel according to claim 4, wherein at least one of the plurality of first transition lines does not overlap with at least one of the plurality of second transition lines, and at least one of the plurality of first transition lines does not overlap with at least one of the plurality of first connection lines.

9. The light emitting panel according to claim 4, wherein at least one of the plurality of first transition lines does not overlap with at least one of the plurality of second transition lines, or at least one of the plurality of first transition lines does not overlap with at least one of the plurality of first connection lines.

10. The light emitting panel according to claim 3, wherein the line connection board is a flexible circuit board.

11. The light emitting panel according to claim 1, further comprising:
a driving chip fixed on the carrier substrate, wherein
the driving chip is electrically connected with the plurality of first electrode leads and the plurality of second electrode leads.

12. The light emitting panel according to claim 1, wherein the connection electrode, the first electrode lead and the second electrode lead are arranged on a same side of the carrier substrate and arranged in a same layer.

13. The light emitting panel according to claim 1, wherein
the connection electrode and one of the first electrode lead and the second electrode lead are arranged on a same side of the carrier substrate and arranged in a same layer; and
the other of the first electrode lead and the second electrode lead is arranged on a side of the carrier substrate facing away from the connection electrode, and is electrically connected with the connection electrode via a via-hole.

14. The light emitting panel according to claim 13, wherein
at least one of the plurality of first electrode leads is opposite to a first gap between adjacent second electrode leads among the plurality of second electrode leads and covers the first gap; and
at least one of the plurality of second electrode leads is opposite to a second gap between adjacent first electrode leads among the plurality of first electrode leads and covers the second gap.

15. The light emitting panel according to claim 13, wherein
at least one of the plurality of first electrode leads is opposite to a first gap between adjacent second electrode leads among the plurality of second electrode leads and covers the first gap; or
at least one of the plurality of second electrode leads is opposite to a second gap between adjacent first electrode leads among the plurality of first electrode leads and covers the second gap.

16. The light emitting panel according to claim 1, wherein
one of the first sub-connection electrode and the second sub-connection electrode is a positive electrode, and the other of the first sub-connection electrode and the second sub-connection electrode is a negative electrode; and among the plurality of first electrode leads and the plurality of second electrode leads, a line width of at least one electrode lead connected with the positive electrode is greater than a line width of an electrode lead connected with the negative electrode.

17. The light emitting panel according to claim 1, wherein a thickness of the first electrode lead, a thickness of the second electrode lead and a thickness of the connection electrode each are greater than or equal to 1 μm and less than or equal to 10 μm.

18. The light emitting panel according to claim 1, further comprising:
light emitting elements respectively electrically connected with the plurality of connection electrodes, wherein the light emitting element comprises a micro light emitting diode.

19. The light emitting panel according to claim 1, wherein the plurality of connection electrodes are arranged in an array of N rows by M columns, wherein an i-th connection electrode row corresponds to the i-th connection electrode group, and M is an integer greater than or equal to 2; or
the plurality of connection electrodes are arranged in an array of N columns by M rows, wherein an i-th connection electrode column corresponds to the i-th connection electrode group, and M is an integer greater than or equal to 2.

20. A display device, comprising:
a light emitting panel, wherein the light emitting panel comprises:
a carrier substrate; and
a plurality of connection electrodes, a plurality of first electrode leads and a plurality of second electrode leads that are arranged on the carrier substrate, wherein
each of the plurality of connection electrodes comprises a first sub-connection electrode and a second sub-connection electrode which are isolated from each other, the plurality of connection electrodes are divided into a first connection electrode group to an N-th connection electrode group, and an i-th connection electrode group comprises connection electrodes among the plurality of connection electrodes, N is an integer greater than or equal to 2, and i is a positive integer less than or equal to N; and
first sub-connection electrodes in the i-th connection electrode group are electrically connected with a same first electrode lead among the plurality of first electrode leads, and second sub-connection electrodes in the i-th connection electrode group are respectively connected with different second electrode leads among the plurality of second electrode leads.

* * * * *